(12) United States Patent
Hasegawa et al.

(10) Patent No.: US 6,768,174 B2
(45) Date of Patent: Jul. 27, 2004

(54) COMPLEMENTARY MOS TRANSISTORS HAVING P-TYPE GATE ELECTRODES

(75) Inventors: Hisashi Hasegawa, Chiba (JP); Jun Osanai, Chiba (JP)

(73) Assignee: Seiko Instruments Inc., Chiba (JP)

( * ) Notice: Subject to any disclaimer, the term of this patent is extended or adjusted under 35 U.S.C. 154(b) by 0 days.

(21) Appl. No.: 10/234,878

(22) Filed: Sep. 4, 2002

(65) Prior Publication Data

US 2003/0047782 A1 Mar. 13, 2003

(30) Foreign Application Priority Data

Sep. 7, 2001 (JP) ........................ 2001-271926
Aug. 23, 2002 (JP) ........................ 2002-243211

(51) Int. Cl.[7] .............................................. H01L 27/13
(52) U.S. Cl. ........................... 257/350; 257/358
(58) Field of Search ................................ 257/204, 206, 257/347–350, 354, 357–360, 369, 371, 372, 377, 379, 380, 536–538

(56) References Cited

U.S. PATENT DOCUMENTS 4,423,369 A * 12/1983 Alaspa et al. ............... 323/303
5,554,873 A * 9/1996 Erdeljac et al. ............. 257/380
5,939,753 A * 8/1999 Ma et al. ..................... 257/339
6,261,915 B1 * 7/2001 Eklund et al. ............... 438/384

* cited by examiner

Primary Examiner—Wael Fahmy
Assistant Examiner—Marcos D. Pizarro-Crespo
(74) Attorney, Agent, or Firm—Adams & Wilks

(57) ABSTRACT

A complementary MOS semiconductor device is provided which is manufactured at low cost and in a short manufacturing period, which enables low voltage operation, and has low power consumption and high driving capability, and which can realizes a power management semiconductor device or an analog semiconductor device at high speed operation. A gate electrode of a CMOS is formed of p-type polycrystalline silicon of a singe polarity or a p-type polycide structure. A PMOS is of surface channel type, and thus, enables a shorter channel and a lower threshold voltage. Also, an NMOS of buried channel type has an extremely shallow buried channel since arsenic having a small diffusion coefficient is used as an impurity for threshold control in the NMOS, and thus, enables a shorter channel and a lower threshold voltage. Further, a resistor used in a voltage dividing circuit or a CR circuit is comprised of polycrystalline silicon different from that for the gate electrode, and thus, a voltage dividing circuit with high precision is provided. Accordingly, the high-speed power management semiconductor device or analog semiconductor device is realized.

42 Claims, 10 Drawing Sheets

COMPLEMENTARY MOS TRANSISTORS HAVING P-TYPE GATE ELECTRODES

BACKGROUND OF THE INVENTION

1. Field of the Invention

The present invention relates to a complementary MOS semiconductor device having a resistor circuit structured on an SOI (silicon on insulator) substrate, in which a low voltage operation, low power consumption, and high driving capability are required, and particularly to a power management semiconductor device such as a voltage detector (hereinafter referred to as VD), a voltage regulator (hereinafter referred to as VR), or a switching regulator (hereinafter referred to as SWR) or an analog semiconductor device such as an operational amplifier or a comparator.

2. Description of the Related Art

Complementary MOS semiconductor devices having a resistor circuit in which a resistor is formed of polycrystalline silicon or the like are widely used. FIG. 18 shows the structure of a conventional semiconductor device provided with a resistor circuit. The semiconductor device is composed of a complementary MOS structure (hereinafter referred to as CMOS) which is comprised of an n-channel MOS transistor (hereinafter referred to as NMOS) a gate electrode of which is comprised of n+ polycrystalline silicon and a p-channel MOS transistor (hereinafter referred to as PMOS) which is formed in an n-well region and a gate electrode of which is also comprised of n+ polycrystalline silicon, and a resistor which is formed on a field insulating film and which is used for a voltage dividing circuit for dividing a voltage or a CR circuit for setting a time constant, which are all formed on a p-type semiconductor substrate (for example, refer to patent document 1)

JP 10-303315 A (page. 1, and FIG. 1)

In the complementary MOS (CMOS) semiconductor device having a resistor circuit, n+ polycrystalline silicon is often used for a gate electrode in view of the ease of manufacture and stability. In this case, an NMOS is a surface channel type based on the relationship of a work function between the gate electrode and the semiconductor substrate while in a PMOS, a threshold voltage is about −1 V based on the relationship of a work function between the gate electrode and the semiconductor substrate. Thus, when impurity implantation is conducted in order to reduce the threshold voltage, the PMOS becomes a shallow buried channel type in which a channel is formed in the portion that is beneath the surface of the substrate. The buried channel type has an advantage that mobility is high since a carrier passes through the interior of the substrate. However, in the buried channel type device, when the threshold voltage is lowered, the subthreshold characteristics are severely deteriorated, which leads to an increase in leak current. Therefore, it is more difficult to attain a lower voltage and a shorter channel in the PMOS than in the NMOS.

Further, as a structure that realizes a lower voltage in both the NMOS and the PMOS, there is known the same polarity gate structure in which the polarity of a gate electrode is the same as the polarity of a transistor, as shown in FIGS. 19 or 20. In this structure, n+ polycrystalline silicon is used for the gate electrode of an NMOS transistor and p+ polycrystalline silicon is used for the gate electrode of a PMOS transistor. Thus, both the NMOS transistor and the PMOS transistor are of the surface channel type, which can suppress a leak current, thereby being capable of attaining a lower voltage. However, the number of manufacturing steps is increased because the polarities of the gate electrodes are different from each other, which invites an increase in manufacturing cost and manufacturing time. Further, in an inverter circuit, which is the most basic type of circuit element in general, a connection between the gates of the NMOS and the PMOS through metal is avoided in order to improve surface efficiency. The inverter circuit is laid out with one continuous polycrystalline silicon or a polycide structure that consists of a laminated structure of polycrystalline silicon and high melting point metal silicide from the NMOS to the PMOS in a plane manner. Then, there are problems in terms of costs and characteristics in that, in the case of the polycrystalline silicon single layer shown in FIG. 19, impedance of a pn junction in the polycrystalline silicon is high and thus is unpractical, and in that, in the case of the polycide structure shown in FIG. 20, n-type and p-type impurities diffuse to the gate electrodes having opposite conductivities, respectively, at high speed in the high melting point metal silicide during heat treatment in a step, as a result of which the work function varies, and the threshold voltage is not stable.

Further, in recent years, while reduction in size and reduction in weight has progressed, lower power consumption, higher speed, and increased functionality are required in portable equipment such as portable telephones or PDAs. Along with this, electronic components that constitute the portable equipment need to be reduced in size and operated at a higher speed. However, a power management semiconductor device such as a switching regulator needs to have a withstand voltage of about 10 V, and thus, is difficult to be operated at a higher speed resulting from the attainment of higher definition.

SUMMARY OF THE INVENTION

The present invention has been made in view of the above, and therefore an object of the present invention is to provide a complementary MOS semiconductor device which is manufactured at low cost and in a short manufacturing period, enables low voltage operation, and has low power consumption and high driving ability and which can realizes a power management semiconductor device or an analog semiconductor device at high speed operation.

In order to solve the above object, the present invention takes the following means.

(1) There is provided a SOI complementary MOS semiconductor device, which is constituted by an n-type MOS transistor, a p-type MOS transistor, and resistors which are formed on a semiconductor thin film layer in an SOI (silicon on insulator) substrate which is constituted by an insulating film formed on a semiconductor substrate and the semiconductor thin film layer formed on the insulating film, in which: a polarity of a gate electrode of the n-type MOS transistor is p-type; a polarity of a gate electrode of the p-type MOS transistor is p-type; and the resistors are formed of a material different from that for the p-type gate electrode of the n-type MOS transistor and the p-type gate electrode of the p-type MOS transistor.

There is provided a SOI complementary MOS semiconductor device, in which:

(2) the p-type gate electrode of the n-type MOS transistor and the p-type gate electrode of the p-type MOS transistor are formed of first polycrystalline silicon;

(3) the p-type gate electrode of the n-type MOS transistor and the p-type gate electrode of the p-type MOS transistor are formed of a laminate polycide structure that consists of a lamination layer of first polycrystalline silicon and first high melting point metal silicide;

(4) the resistors are formed of second polycrystalline silicon that is different from a material for the p-type gate electrode of the n-type MOS transistor and the p-type gate electrode of the p-type MOS transistor;

(5) the resistors formed of the second polycrystalline silicon include at least a first n-type resistor at a relatively low concentration;

(6) the resistors formed of the second polycrystalline silicon include at least a second n-type resistor at a relatively high concentration;

(7) the resistors formed of the second polycrystalline silicon include at least a first p-type resistor at a relatively low concentration;

(8) the resistors formed of the second polycrystalline silicon include at least a second p-type resistor at a relatively high concentration;

(9) the p-type gate electrode formed of the first polycrystalline silicon has a film thickness of 2000 Å to 6000 Å;

(10) in the p-type gate electrode formed of the laminate polycide structure that consists of the lamination layer of the first polycrystalline silicon and the first high melting point metal silicide, the first polycrystalline silicon has a thickness of 500 Å to 2500 Å, and the first high melting point metal silicide has a thickness of 500 Å to 2500 Å;

(11) the resistors formed of the second polycrystalline silicon each have a thickness of 500 Å to 2500 Å;

(12) the first n-type resistor at a relatively low concentration which is formed of the second polycrystalline silicon contains phosphorous or arsenic at an impurity concentration of $1 \times 10^{14}$ to $9 \times 10^{18}$ atoms/cm$^3$, and the sheet resistance value is approximately several k$\Omega$/□ to several tens k$\Omega$/□;

(13) the second n-type resistor at a relatively high concentration which is formed of the second polycrystalline silicon contains phosphorous or arsenic at an impurity concentration of $1 \times 10^{19}$ to $5 \times 10^{21}$ atoms/cm$^3$, the sheet resistance value is approximately 100 $\Omega$/□ to several hundreds $\Omega$/□, and the temperature coefficient is approximately several hundreds ppm/° C. to several thousands ppm/° C.;

(14) the first p-type resistor at a relatively low concentration which is formed of the second polycrystalline silicon contains boron or BF$_2$ at an impurity concentration of $1 \times 10^{14}$ to $9 \times 10^{18}$ atoms/cm$^3$, and the sheet resistance value is approximately several k$\Omega$/□ to several tens k$\Omega$/□;

(15) the second p-type resistor at a relatively high concentration which is formed of the second polycrystalline silicon contains boron or BF$_2$ at an impurity concentration of $1 \times 10^{19}$ to $5 \times 10^{21}$ atoms/cm$^3$, the sheet resistance value is approximately several hundreds $\Omega$/□ to 1 k$\Omega$/□, and the temperature coefficient is approximately several hundreds ppm/° C. to several thousands ppm/° C.;

(16) the resistor consists of a thin film metal resistor that is comprised of Ni—Cr alloy, chrome silicide, molybdenum silicide, or β-ferrite silicide, and has a thickness of 100 Å to 300 Å;

(17) the first polycrystalline silicon that forms the p-type gate electrode of the n-type MOS transistor and the p-type gate electrode of the p-type MOS transistor contains boron or BF$_2$ at an impurity concentration of $1 \times 10^{18}$ atoms/cm$^3$ or more;

(18) the first high melting point metal silicide is tungsten silicide, molybdenum silicide, titanium silicide, or platinum silicide;

(19) the n-type MOS transistor and the p-type MOS transistor at least include a MOS transistor having a first structure that is a single drain structure in which a source and a drain are each comprised of a diffusion layer at a high impurity concentration which overlaps the p-type gate electrode in a plane manner;

(20) the n-type MOS transistor and the p-type MOS transistor at least include a MOS transistor having a second structure which is constituted by a diffusion layer at a low impurity concentration in which a source and a drain overlap the p-type gate electrode in a plane manner and a diffusion layer at a high impurity concentration in which only a drain does not overlap the p-type gate electrode or both of the source and drain do not overlap the p-type gate electrode;

(21) the n-type MOS transistor and the p-type MOS transistor at least include a MOS transistor having a third structure: which is constituted by a diffusion layer at a low impurity concentration in which a source and a drain overlap the p-type gate electrode in a plane manner and a diffusion layer at a high impurity concentration in which only a drain does not overlap the p-type gate electrode or both of the source and drain do not overlap the p-type gate electrode; and in which an insulating film between the diffusion layer at a high impurity concentration and the p-type gate electrode is thicker than a gate insulating film;

(22) the n-type MOS transistor and the p-type MOS transistor at least include a MOS transistor having a fourth structure which is constituted by a diffusion layer at a high impurity concentration in which a source and a drain overlap the p-type gate electrode in a plane manner and a diffusion layer at a low impurity concentration in which only a drain or both of the source and drain extend more to the channel side than the diffusion layer at a high impurity concentration and overlap the p-type gate electrode in a plane manner;

(23) an impurity concentration of the diffusion layer at a low impurity concentration in each of the second structure MOS transistor, the third structure MOS transistor and the fourth structure MOS transistor is $1 \times 10^{16}$ to $1 \times 10^{18}$ atoms/cm$^3$, and an impurity concentration of the diffusion layer at a high impurity concentration in each of the first structure MOS transistor, the second structure MOS transistor, the third structure MOS transistor, and the fourth structure MOS transistor is $1 \times 10^{19}$ atoms/cm$^3$ or more;

(24) an impurity of the diffusion layer at a low impurity concentration in each of the second structure MOS transistor, the third structure MOS transistor, and the fourth structure MOS transistor of the n-type MOS transistor is phosphorous, and an impurity of the diffusion layer at a high impurity concentration in each of the first structure MOS transistor, the second structure MOS transistor, the third structure MOS transistor, and the fourth structure MOS transistor of the n-type MOS transistor is arsenic or phosphorous;

(25) an impurity of the diffusion layer at a low impurity concentration in each of the second structure MOS transistor, the third structure MOS transistor, and the fourth structure MOS transistor of the p-type MOS transistor is boron or BF$_2$, and an impurity of the diffusion layer at a high impurity concentration in each of the first structure MOS transistor, the second structure MOS transistor, the third structure MOS transistor, and the fourth structure MOS transistor of the p-type MOS transistor is boron or BF$_2$;

(26) the n-type MOS transistor includes a first n-type MOS transistor having a threshold voltage of buried channel type and enhancement type;

(27) the n-type MOS transistor includes a second n-type MOS transistor having a threshold voltage of buried channel type and depletion type;

(28) the p-type MOS transistor includes a first p-type MOS transistor having a threshold voltage of surface channel type and enhancement type;

(29) the p-type MOS transistor includes a second p-type MOS transistor having a threshold voltage of buried channel type and depletion type;

(30) the semiconductor thin film layer has a thickness of 0.1 μm to 1 μm;

(31) the insulating film formed on the semiconductor substrate has a thickness of 0.1 μm to 1 μm;

(32) the insulating film formed on the semiconductor substrate is formed of an insulating material such as glass, sapphire, or ceramic such as a silicon oxide film or a silicon nitride film;

(33) an element separation structure formed on the semiconductor substrate consists of an insulating film formed by a LOCOS method;

(34) an element separation structure formed on the semiconductor substrate is a trench element separation structure in which the semiconductor thin film layer is etched to the depth that reaches the buried insulating film to form a concave portion;

(35) The interior of the concave portion of the trench element separation structure is filled by a deposited insulating film; or

(36) The interior of the concave portion of the trench element separation structure is filled by third polycrystalline silicon different from the material for the p-type gate electrode and for the resistor comprised of the second polycrystalline silicon.

DETAILED DESCRIPTION OF THE PREFERRED EMBODIMENTS

Hereinafter, embodiments according to the present invention will be described with reference to the accompanying drawings.

Figure 1:
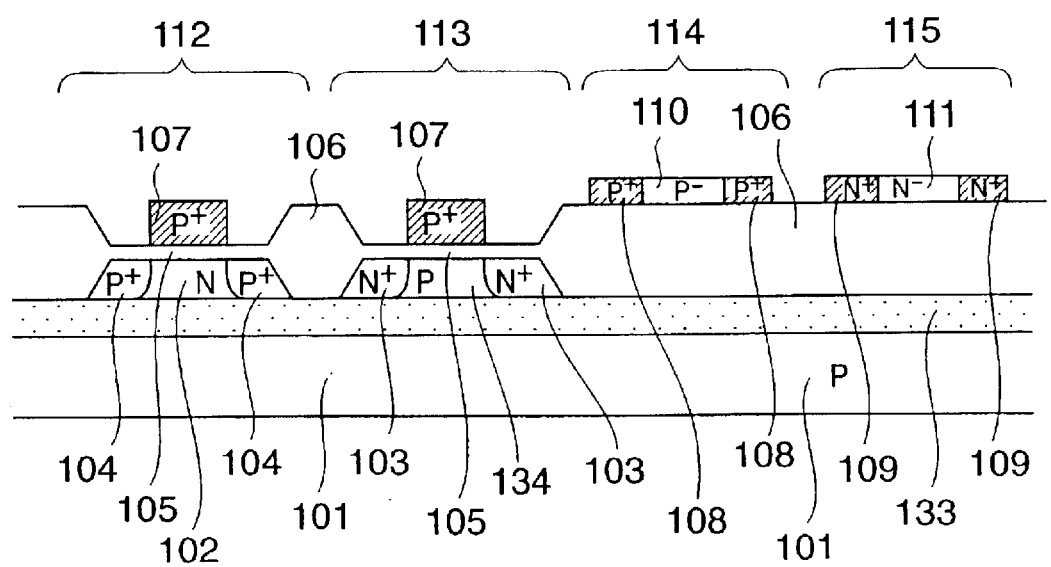
FIG. 1 is a schematic sectional view of an embodiment of a CMOS semiconductor device according to the present invention.

FIG. 1 is a schematic sectional view of an embodiment of a CMOS semiconductor device according to the present invention. The structure of the CMOS semiconductor device includes, on an SOI substrate constituted by a p-type semiconductor substrate 101, a buried insulating film 133, and a p-type semiconductor thin film layer 134 for forming an element: a CMOS constituted by an NMOS 113, in which a gate electrode is formed in the p-type semiconductor thin film layer 134 and is comprised of p+ polycrystalline silicon 107 and in which a source and a drain take a so-called single drain structure, and a PMOS 112, in which a gate electrode is formed in an n-well region 102 and is also comprised of the p+ polycrystalline silicon 107 and which takes a single drain structure; and a p− resistor 114 and an n− resistor 115 which are formed on a field insulating film 106 and each of which is comprised of polycrystalline silicon and is used for a voltage dividing circuit for dividing a voltage, a CR circuit for setting a time constant, or the like.

In the SOI substrate, the thicknesses of the buried insulating film and the semiconductor thin film layer are determined in accordance with the operation voltage. The thickness of the buried insulating film is 1000 Å to 1 μm, and also, the thickness of the semiconductor thin film layer is 1000 Å to 1 μm. The p+ polycrystalline silicon 107 constituting the gate electrode contains an acceptor impurity such as boron or $BF_2$ at a concentration of $1 \times 10^{18}$ atoms/cm$^3$ or more.

In FIG. 1, the polycrystalline silicon 107 that constitutes the gate electrode of the CMOS and the polycrystalline silicon resistors 114 and 115 are formed by separate steps, and have different thicknesses; the polycrystalline silicon resistor is formed with a thickness thinner than that of the gate electrode. For example, the gate electrode 107 has a thickness of about 2000 Å to 6000 Å; on the other hand, the resistor is formed with a thickness of 500 Å to 2500 Å. This is because, in the polycrystalline silicon resistor, a sheet resistance value can be set higher, and also the temperature characteristics are improved more, with a thinner thickness. Thus, precision can further be improved. The sheet resistance value is made to fall in a range of several k$\Omega$/□ to several tens k$\Omega$/□ in a general voltage dividing circuit although depending on the application of the resistance. As to an impurity in this case, boron or $BF_2$ is used at a concentration of approximately $1 \times 10^{14}$ to $9 \times 10^{18}$ atoms/$cm^3$ in the p– resistor 114, and phosphorous or arsenic is used at a concentration of approximately $1 \times 10^{14}$ to $9 \times 10^{18}$ atoms/$cm^3$ in the n– resistor 115.

In FIG. 1, both the p– resistor 114 and the n– resistor 115 are shown. However, taking into consideration the features of the resistors and the property required for products, there is a case where either the p– resistor 114 or the n– resistor 115 is mounted with the purpose of reducing the number of steps and manufacturing costs.

Figure 2:
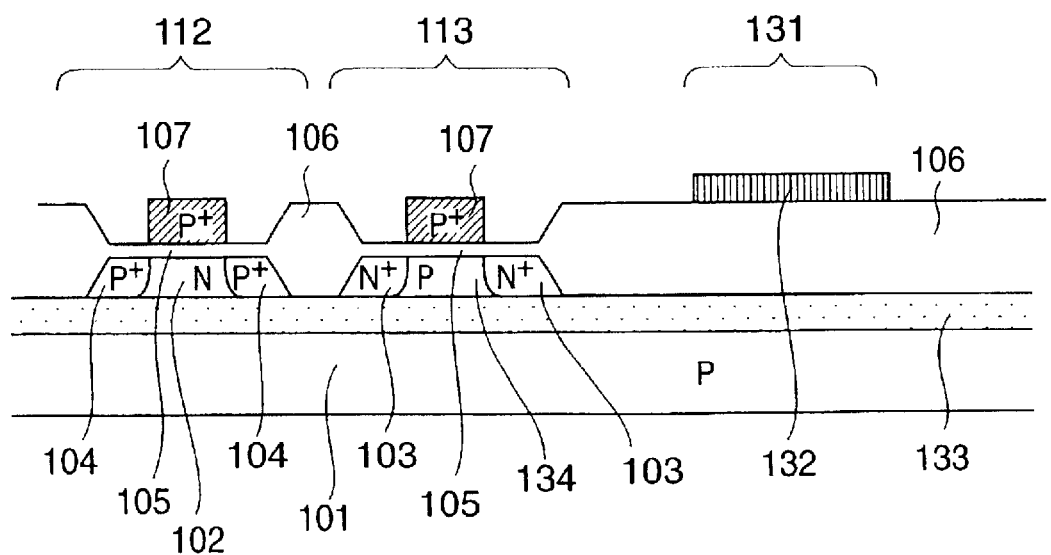
FIG. 2 is a schematic sectional view of another embodiment of a CMOS semiconductor device according to the present invention.

Further, since the gate electrode and the resistors are formed by separate steps, thin film metal can be used for the resistor instead of the polycrystalline silicon. FIG. 2 is a schematic sectional view of another embodiment of a CMOS semiconductor device of the present invention. Here, chrome silicide 132 is used for a thin film metal resistor 131, but Ni—Cr alloy or metal silicide such as molybdenum silicide or β-ferrite silicide also can be used. Chrome silicide has higher resistance among the kinds of metal silicide, and can be used for a resistor by being formed into a thin film with a thickness of 100 Å to 300 Å. By using the thin film metal resistor instead of the polycrystalline silicon, the ratio precision of the voltage dividing circuit, variation of a resistance value, and a temperature coefficient can be made small.

In the PMOS 112, the gate electrode is comprised of the p+ polycrystalline silicon 107, whereby a channel of an E-type PMOS is a surface channel based on the relationship of a work function between the N-well 102 and the gate electrode. However, in the surface channel type PMOS, even if the threshold voltage is set to 0.5 V or more, extreme deterioration of a subthreshold coefficient does not occur, and both low voltage operation and low power consumption are enabled.

On the other hand, in the NMOS 113, a channel of an e-type NMOS is a buried channel based on the relationship of a work function between the gate electrode comprised of the p+ polycrystalline silicon 107 and the p-type semiconductor thin film layer 134. However, arsenic having a small diffusion coefficient can be used as a donor impurity for threshold control in the case where a threshold value is set to a desired value, and thus, the channel is an extremely shallow buried channel. Therefore, even if the threshold voltage is set to a small value of 0.5 V or less, the deterioration of sub-threshold or the increase of a leak current can be remarkably suppressed in comparison with the case of the e-type PMOS: in which boron having a large diffusion coefficient and a large projection range for ion implantation has to be used as an acceptor impurity for threshold control, whereby a deep buried channel is provided; and the gate electrode is comprised of n+ polycrystalline silicon.

From the above description, it will be understood that the CMOS according to the present invention, in which the p+ polycrystalline silicon of a single polarity is used for the gate electrode, is an effective technique to low voltage operation and low power consumption in comparison with the conventional CMOS in which n+ polycrystalline silicon of a single polarity is used for the gate electrode.

In terms of the low voltage operation and low power consumption, a so-called same polarity gate CMOS technique is generally known. In the same polarity gate formation, at least two masking steps needs to be added to a general single polarity gate process in order to separately form p-type and n-type gate electrodes. The standard number of masking steps in the single polarity gate CMOS is appropriately 10, and the cost of steps is increased by 20% at a rough estimate in the same polarity gate formation. Thus, from the total viewpoint of performance and cost of a semiconductor device as well, it can be said that the CMOS with the gate electrode comprised of the p+ polycrystalline silicon of a single polarity according to the present invention is effective.

Further, in the case of the CMOS in which the conventional gate electrode is the n+ polycrystalline silicon single polarity gate electrode, phosphorous diffusion in a diffusion furnace is generally used for doping of an n-type impurity to polycrystalline silicon. In this case, a hard mask such as an oxide film or an insulating film is required for the formation of a resistor, and in particular, a p-type resistor that is more advantageous than an n-type resistor in terms of high resistance can be formed only through a more complicated step. However, in the p+ polycrystalline silicon single polarity gate CMOS, doping of an impurity into gate polycrystalline silicon is conducted by an ion implantation method that does not require a hard mask, and thus, the formation of both the p– resistor and the n– resistor is possible by a simple step. In terms of this point as well, the present invention has an advantage.

Figure 3:
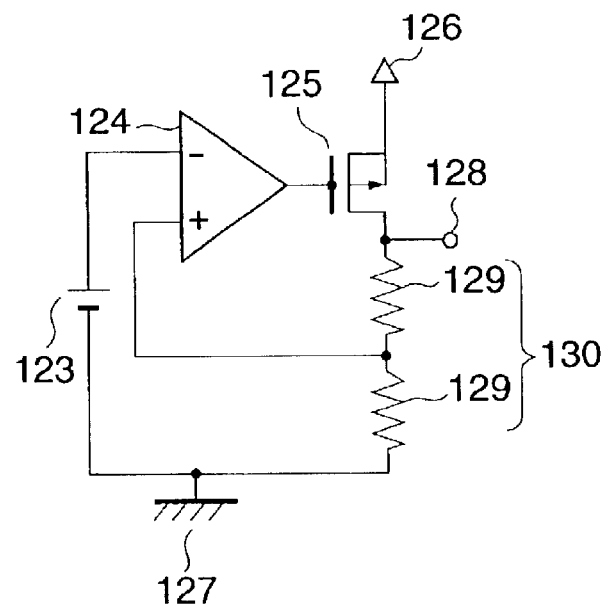
FIG. 3 shows an outline of a structure of a positive VR that consists of a semiconductor device.

Next, a specific effect in the case where the present invention is applied to an actual product is described with reference to FIG. 3. FIG. 3 shows an outline of a structure of a positive VR that consists of a semiconductor device. The VR is constituted by a reference voltage circuit 123, an error amplifier 124, a PMOS output element 125, and a voltage dividing circuit 130 that consists of resistors 129, and is a semiconductor device having a function of always outputting a constant voltage together with a required current value from an output terminal 128 even with an input of an arbitrary voltage to an input terminal 126.

In recent years, as to a VR particularly for a portable device, lowering of an input voltage, reduction in power consumption, an output of a high current with a small difference between input and output potentials, increase in precision of output voltage, reduced cost, reduction in size, and the like have been demanded by the market. The high priorities are particularly given to the lowering of cost and the reduction in size is reducing size of the PMOS output element.

In response to the above requests, an error amplifier, a PMOS output element, and a reference voltage circuit are structured by using the structure of the present invention, namely, a CMOS that attains low cost and a low threshold voltage, and a voltage dividing circuit is structured by a p– resistor which is formed at low cost and has high resistance and high precision, whereby the VR enables low voltage operation, low power consumption, and high precision of an output voltage.

Further, it is specifically described that the structure of the present invention provides an extremely great effect of lowering of cost, that is, reduction in size of a chip and reduction in size of a device, which correspond to the request of high priority. The VR outputs a current of several tens mA to several hundreds mA. This completely depends on the driving ability of a PMOS output element, and the PMOS output element may occupy substantially the half of a chip surface area depending on a product. Therefore, it is the key to realize the lowering of cost and the reduction in size of a device how the size of the PMOS output element is reduced.

On the other hand, it is described that the requests for lowering of an input voltage and for a high current output with a small difference between input and output potentials are strong in the market. These requests mean that a voltage applied to a gate in the PMOS output element is made smaller and that a higher current is provided in an unsaturated operation mode in which a source-drain voltage is small. A drain current of a MOS transistor in an unsaturated operation is expressed by expression (1) below.

$$Id=(\mu \cdot Cox \cdot W/L) \times \{(Vgs-Vth)-\frac{1}{2} \cdot Vds\} \times Vds \qquad (1)$$

Id: drain current
$\mu$: mobility
Cox: capacitance of gate insulating film
W: channel width
L: channel length
Vgs: voltage between gate and source
Vth: threshold voltage
Vds: voltage between drain and source In order to obtain a sufficiently large drain without increasing a surface area and even with small Vgs and Vds, the reduction of the channel length and the lowering of Vth need to be performed based on expression (1).

It is understood that the CMOS structure in which a gate is formed of p+ polycrystalline silicon of a single polarity is a very effective means in terms of the lowering of cost and the reduction in size of the VR since the lowering of a threshold voltage and the reduction in the channel length can be conducted while a leak current at the time of off is suppressed. Of course, the same effect can be obtained as to a chip size by also using the same polarity gate CMOS technique. However, this is accompanied with an increase of the number of steps in terms of cost, and thus, the effect does not reach the effect obtained according to the present invention from the total viewpoint.

Further, as to an advantage that arises from the CMOS structure with a p+ polycrystalline silicon single polarity gate according to the present invention in the VR, in the case where the reference voltage circuit is structured by a so-called e/d-type that is composed by an e-type NMOS and a depletion type NMOS (hereinafter referred to as d-type NMOS), both the e-type NMOS and the d-type NMOS are of buried channel type, and thus, the threshold voltage and variation with respect to a temperature change of mutual conductance can be made approximately the same between the MOSs. Therefore, there can be given a point that a reference voltage circuit in which variation of an output voltage with respect to a temperature change is smaller in comparison with a conventional reference voltage circuit that is composed of a surface channel e-type NMOS and a buried channel d-type NMOS in the case where a gate electrode is formed of n+ polycrystalline silicon.

Further, the CMOS structure with a p+ polycrystalline silicon single polarity gate according to the present invention enables the practical use of a PMOS e/d-type reference voltage circuit, which cannot be put to practical use since variation of, in particular, the d-type threshold voltage, is large in the conventional n+ polycrystalline silicon gate structure. Therefore, the present invention has also advantages that any of the NMOS and the PMOS can be selected in the e/d-type reference voltage circuit and that a degree of freedom in a circuit design is increased.

Further, since an SOI substrate is used, complete element separation can be realized by making the field insulating film 106 adhere with the buried insulating film 133. Thus, reduction in separation width, namely, reduction in size of a chip can be realized, and a noise-free state is obtained. Further, although it is impossible that the NMOS is operated at a higher potential than that of the PMOS in a bulk CMOS, the NMOS can be operated at a higher potential than that of the PMOS in the CMOS using the SOI substrate. The effect is very large.

The effect of the present invention in the VR is described above. In addition, by applying the present invention, the same great effect as in the VR can be obtained also in an SWR mounted with a high output element or a VD in which the requests for low voltage operation, low power consumption, low cost, and reduction in size are strong.

Figure 4:
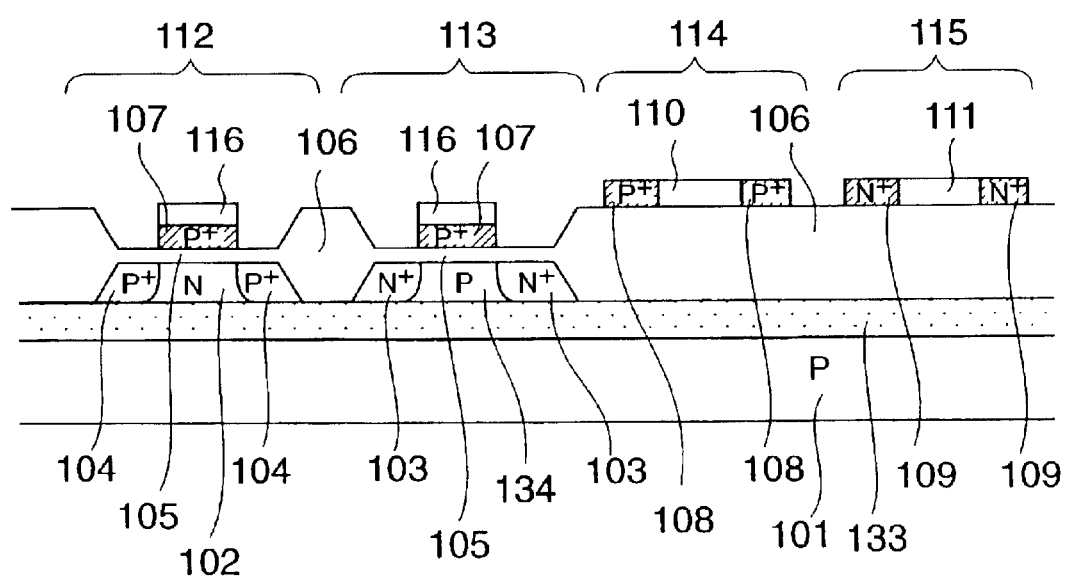
FIG. 4 is a schematic sectional view of another embodiment of a CMOS semiconductor device according to the present invention.

FIG. 4 is a schematic sectional view of another embodiment of a CMOS semiconductor device according to the present invention. In the embodiment of the present invention in FIG. 1, the gate electrode is formed of the p+ polycrystalline silicon single layer, and this case has a problem in that the sheet resistance of the p+ polycrystalline silicon single layer has a large value of about 100 Ω/□, and thus, the p+ polycrystalline silicon single layer is difficult to be applied to a semiconductor device that needs to be adapted for high-speed operation and high frequency. As measures to cope with the problem, there is shown in FIG. 4 a so-called polycide structure in which high melting point metal silicide 116 such as tungsten silicide, molybdenum silicide, titanium silicide, or platinum silicide is formed on the p+ polycrystalline silicon 107 and which is taken for a gate electrode to attain low resistance. The sheet resistance value depends on the kind and thickness of the high melting point metal silicide, and a standard sheet resistant value of several tens Ω/□ to several Ω/□ is obtained with a thickness of 500 Å to 2500 Å. Since the MOS operation itself is determined in accordance with a work function between p+ polycrystalline silicon and a semiconductor, the same effect can be obtained as described in FIG. 1 in terms of low voltage operation, low power consumption, and low cost. Thus, performance of the semiconductor device is further improved by an amount corresponding to reduction in resistance of the gate electrode.

Further, in FIG. 4, since the p– resistor 114 and the n– resistor 115 are formed of a polycrystalline silicon layer different from that of the gate electrode, there is not required a step necessary in forming a resistor from a silicon polycrystalline single layer, for example, a complicated step flow in which: high melting point metal silicide is not previously coated on polycrystalline silicon that becomes a resistor; or high melting point metal silicide is once coated on polycrystalline silicon, and then, the high melting point metal silicide on the portion is selectively removed.

Figure 5:
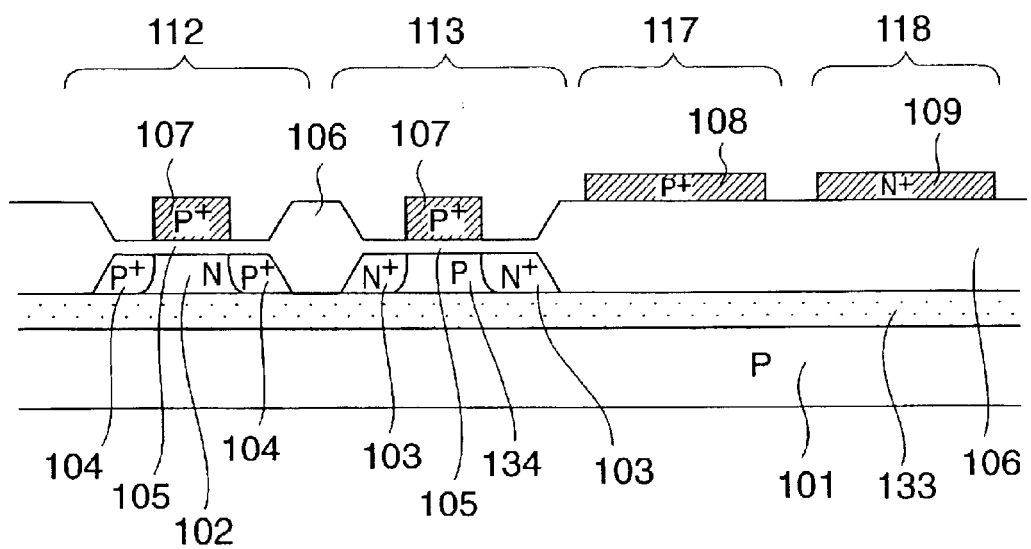
FIG. 5 is a schematic sectional view of another embodiment of a CMOS semiconductor device according to the present invention.

FIG. 5 is a schematic sectional view of another embodiment of a CMOS semiconductor device according to the present invention. The CMOS structure with p+ polycrystalline silicon of a single polarity has the same structure as in the embodiment in FIG. 1, and has the same effect as in the embodiment in FIG. 1 in terms of low voltage operation, low power consumption, and low cost. The embodiment in FIG. 5 is different from the embodiment in FIG. 1 in that resistors formed of polycrystalline silicon are a p+ resistor 117 and an n+ resistor 118 at a relatively high impurity concentration and with low resistance. In a resistor circuit such as a voltage dividing circuit, which has a relatively high sheet resistance value and in which ratio precision is important, the p− resistor or the n− resistor shown in the embodiment in FIG. 1 is effective. However, in a resistor in which absolute-value precision is important or a resistor in which a small temperature coefficient is required, such as a CR circuit for determining a time constant, the absolute-value precision and the temperature coefficient are improved more when an impurity concentration is raised and a resistance is made relatively low.

The formation of the p+ resistor 117 and the n+ resistor 118 is attained by, for example, simultaneously conducting impurity doping to polycrystalline silicon with impurity doping in forming the sources and drains of the NMOS and PMOS in the general formation of the CMOS. In this case, as to the p+ resistor 117, boron or $BF_2$ is adopted as an impurity at a concentration of about $1 \times 10^{19}$ atoms/cm$^3$ or more, the sheet resistance value is approximately several hundreds $\Omega/\square$ to 1 k$\Omega/\square$, and the temperature coefficient is about several hundreds ppm/° C. to one thousand ppm/° C. As to the n+ resistor 118, phosphorous or arsenic is adopted as an impurity at a concentration of about $1 \times 10^{19}$ atoms/cm$^3$ or more, the sheet resistance value is about one hundred $\Omega/\square$ to several hundreds $\Omega/\square$, and the temperature coefficient is several hundreds ppm/° C. to one thousand ppm/° C. The CMOS in the embodiment shown in FIG. 5 shows the case where a gate electrode is formed of a polycrystalline silicon single layer. However, the resistor at a relatively high concentration in this embodiment may be applied as the resistor of the CMOS in which the gate electrode has a polycide structure. Further, in FIG. 5, both the n+ resistor 118 and the p+ resistor 117 are shown, but taking the characteristics required in a semiconductor device and the characteristics of the resistors into consideration, the semiconductor device may be structured by using either resistor with the purpose of reducing the number of steps or cost. Moreover, the thin film metal resistor shown in FIG. 2 may be adopted.

Figure 6:
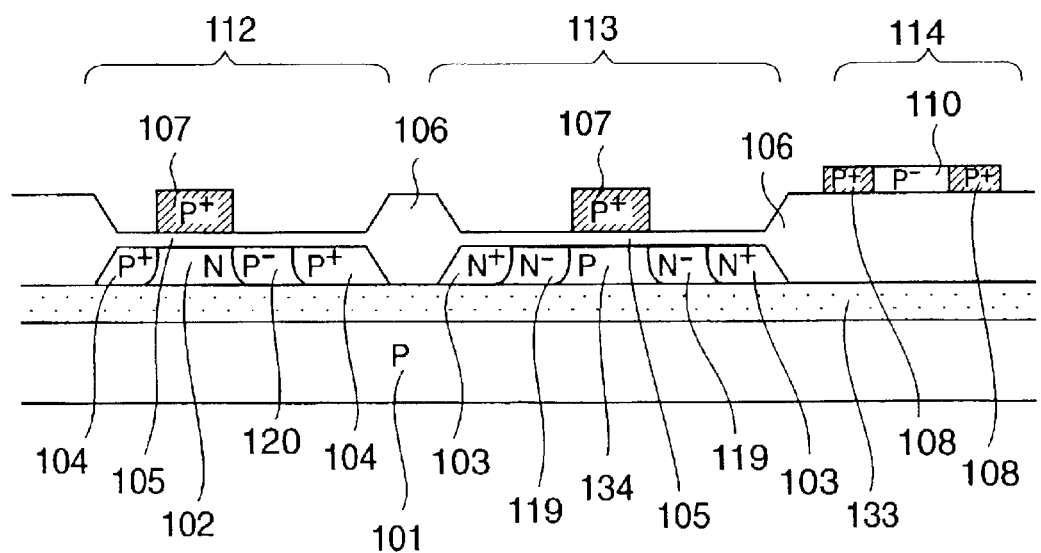
FIG. 6 is a schematic sectional view of another embodiment of a CMOS semiconductor device according to the present invention.

FIG. 6 is a schematic sectional view of another embodiment of a CMOS semiconductor device according to the present invention. In FIG. 6, the CMOS with a gate electrode formed of the p+ polycrystalline silicon 107 of a single polarity which is the basis of the present invention is shown, and has the same effect of low voltage operation, low power consumption, and low cost as in the embodiment in FIG. 1. Further, the CMOS, with the purpose of improving modulation in channel length, of suppressing reduction of reliability due to a hot carrier, and of improving a drain withstand voltage in an analog circuit, has a MOS transistor structure in which: a source and a drain and only a drain are respectively provided as diffusion layers n− 119 and p− 120 at a low impurity concentration; and a source and a drain and only a drain are respectively provided as diffusion layers n+ 103 and p+ 104 at a high impurity concentration which are separated at a distance from the gate electrodes. The structure is adopted to be applied to a VD or VR having a high input voltage or a booster type SWR having a high output voltage. The structure shown in FIG. 6 is formed such that, for example, the diffusion layers at a low impurity concentration are selectively formed, and then, the diffusion layers at a high impurity concentration are selectively provided in a semiconductor by a resist mask and an ion implantation technique.

As to the diffusion layer at a low impurity concentration, in the case of the p− 120 of the PMOS 112, boron or $BF_2$ is used as an impurity at a concentration of approximately $1 \times 10^{16}$ to $1 \times 10^{18}$ atoms/cm$^3$, and in the case of the n− 119 of the NMOS 113, phosphorous or arsenic is used as an impurity at a concentration of approximately $1 \times 10^{16}$ to $1 \times 10^{18}$ atoms/cm$^3$. As to the diffusion layer at a high impurity concentration, in the case of the p+ 104 of the PMOS 112, boron or $BF_2$ is used as an impurity at a concentration of $1 \times 10^{19}$ atoms/cm$^3$ or more, and in the case of the n+ 103 of the NMOS 113, phosphorous or arsenic is used as an impurity at a concentration of $1 \times 10^{19}$ atoms/cm$^3$ or more.

The distance from the gate electrode to the diffusion layer at a high impurity concentration, which is formed apart from the gate electrode, namely, a so-called offset length is generally 0.5 μm to several μm although depending on a voltage input to a semiconductor device. In FIG. 6, the PMOS 112 has an offset structure only on one side thereof while the NMOS 113 has an offset structure on both sides thereof. However, an appropriate structure for a circuit can be selected in accordance with the method of using an element in the circuit irrespective of a conductivity type of a MOS transistor. Normally, in the case where a current direction is a two-way direction and a withstand voltage is needed in the two-way direction with which a source and a drain are exchanged on a case-by-case basis, each of the source and the drain takes the offset structure, and in the case where a current direction is a one-way direction and a source and a drain are fixed, only one side, namely, only the drain takes the offset structure in order to reduce a parasitic capacitance. Further, FIG. 6 shows an example of the p+ polycrystalline silicon single layer as the gate electrode, but the p+ polycide structure shown in FIG. 4 can also be used as the gate electrode. Similarly, as to the resistor, only the p− resistor is shown in FIG. 6, but the n− resistor, the p+ resistor, and the n+ resistor shown in FIG. 1 or 5 may be selectively applied as the occasion demands. Further, the thin film metal resistor shown in FIG. 2 may be adopted.

Figure 7:
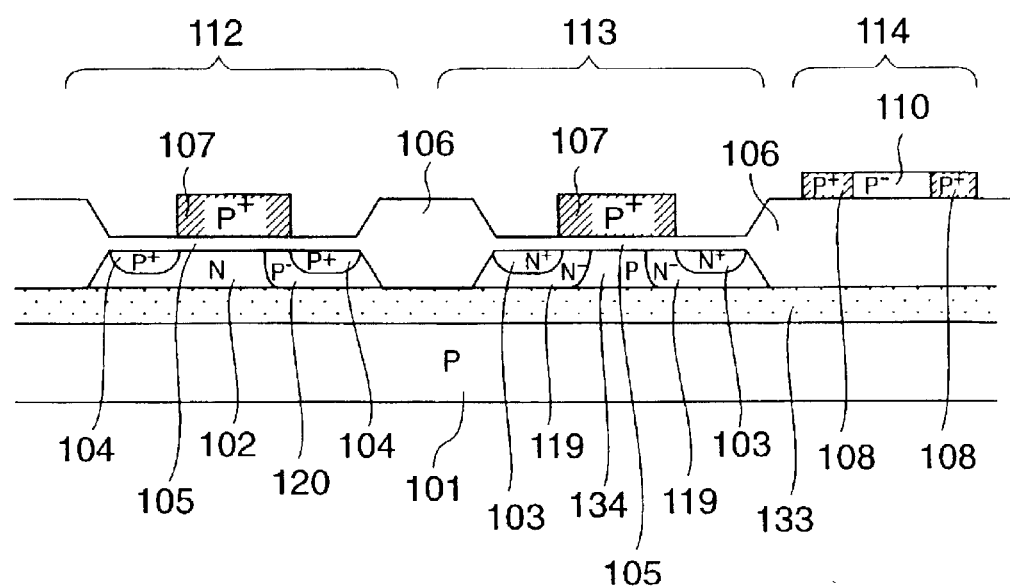
FIG. 7 is a schematic sectional view of another embodiment of a CMOS semiconductor device according to the present invention.

FIG. 7 is a schematic sectional view showing another embodiment of a CMOS semiconductor device according to the present invention. In FIG. 7, the CMOS with a gate electrode formed of the p+ polycrystalline silicon 107 of a single polarity which is the basis of the present invention is shown, and has the same effect of low voltage operation, low power consumption, and low cost as in the embodiment in FIG. 1. Further, the CMOS has a MOS transistor structure that consists of a so-called double diffused drain (DDD) structure in which the diffusion layers n+ 103 and p+ 104 at a high impurity concentration are arranged as a source and a drain so as to overlap the gate electrodes and in which the diffusion layers n− 119 and p− 120 at a low impurity concentration are respectively arranged as a source and a drain and only a drain so as to overlap the gate electrodes. This structure is taken with the purpose of obtaining the same effect as that of the structure shown in FIG. 6, but this embodiment is different from the embodiment shown in FIG. 6 in that this embodiment has a merit that the diffusion layers at a high impurity concentration overlap the gate electrodes, and accordingly, the parasitic capacitance at the time of operation of the MOS can be made small. However, this embodiment also has a demerit that the CMOS is unsuitable for a high frequency operation since the overlap of the gate and the drain, that is, a mirror capacitance is large.

The structure shown in FIG. 7 is formed such that, for example, the diffusion layers at a low impurity concentration are selectively formed by ion implantation and heat treatment, and then, the diffusion layers at a high concentration are provided. As to the diffusion layer at a low impurity concentration, in the case of the p− 120 of the PMOS 112, boron or $BF_2$ is used as an impurity at a concentration of approximately $1\times10^{16}$ to $1\times10^{18}$ atoms/cm$^3$, and in the case of the n− 119 of the NMOS 113, phosphorous or arsenic is used as an impurity at a concentration of approximately $1\times10^{16}$ to $1\times10^{18}$ atoms/cm$^3$. As to the diffusion layer at a high impurity concentration, in the case of the p+ 104 of the PMOS 112, boron or $BF_2$ is used as an impurity at a concentration of $1\times10^{19}$ atoms/cm$^3$ or more, and in the case of the n+ 103 of the NMOS 113, phosphorous or arsenic is used as an impurity at a concentration of $1\times10^{19}$ atoms/cm$^3$ or more.

The difference in the diffusion amount in the lateral direction to the channel side between the low concentration diffusion layers n− 119 and p− 120 and the high concentration diffusion layers n+ 103 and p+ 104 is generally about 0.2 μm to 1 μm. In FIG. 7, the PMOS 112 has a DDD structure only on one side thereof while the NMOS 113 has a DDD structure on both sides thereof. However, an appropriate structure for a circuit can be selected in accordance with the method of using an element in the circuit irrespective of a conductivity type of a MOS transistor. Normally, in the case where a current direction is a two-way direction and a withstand voltage is needed in the two-way direction with which a source and a drain are exchanged on a case-by-case basis, each of the source and the drain takes the DDD structure, and in the case where a current direction is a one-way direction and a source and a drain are fixed, only one side, namely, only the drain takes the DDD structure in order to reduce an effective channel length. Further, FIG. 7 shows an example of the p+ polycrystalline silicon single layer as the gate electrode, but the p+ polycide structure shown in FIG. 4 can also be used as the gate electrode. Similarly, as to the resistor, only the p− resistor is shown in FIG. 7, but the n− resistor, the p+ resistor, and the n+ resistor shown in FIG. 1 or 5 may be selectively applied as the occasion demands. Further, the thin film metal resistor shown in FIG. 2 may be adopted.

Figure 8:
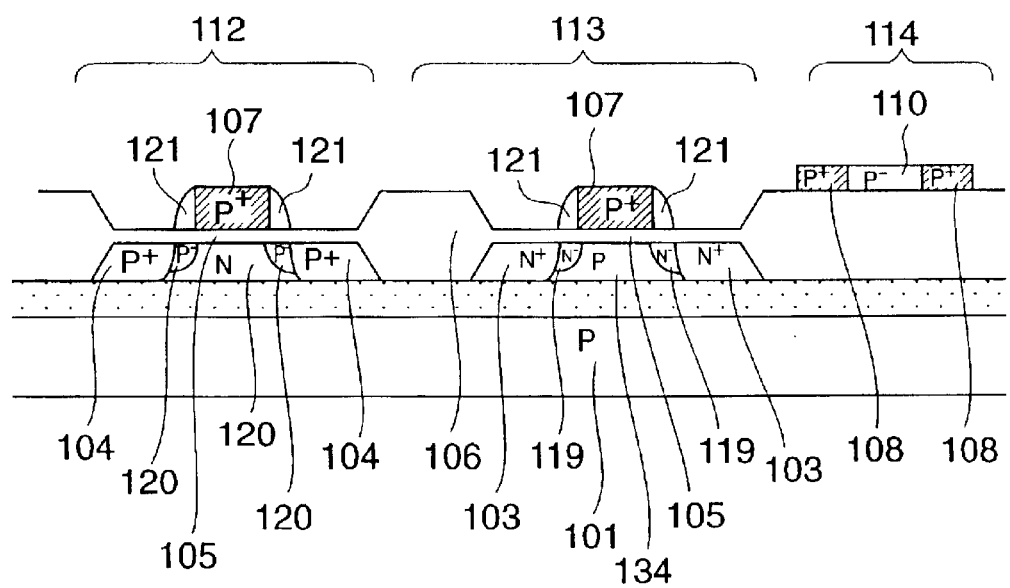
FIG. 8 is a schematic sectional view of another embodiment of a CMOS semiconductor device according to the present invention.

FIG. 8 is a schematic sectional view of another embodiment of a CMOS semiconductor device according to the present invention. In FIG. 8, the CMOS with a gate electrode formed of the p+ polycrystalline silicon 107 of a single polarity which is the basis of the present invention is shown, and has the same effect of low voltage operation, low power consumption, and low cost as in the embodiment in FIG. 1. Further, the CMOS has a MOS transistor structure that consists of a so-called lightly doped drain (LDD) structure in which pairs of sources and drains are respectively constituted of the diffusion layers n− 119 and p− 120 at a low impurity concentration and the diffusion layers n+ 103 and p+ 104 at a high impurity concentration which are provided apart from the gate electrodes at a distance of a side spacer. This structure is taken with the purpose of obtaining the same effect as that of the structures shown in FIGS. 6 and 7, but this embodiment is different from the embodiments shown in FIGS. 6 and 7 in that this embodiment has a structure advantageous to high definition in the point that the diffusion layers at a high impurity concentration are formed in a self-aligning manner while this embodiment has a demerit that there is limitation on an improvement of the withstand voltage.

The structure shown in FIG. 8 is formed such that, for example, the diffusion layers at a low impurity concentration are formed by ion implantation and heat treatment, then, the gate electrodes are coated with an insulating film by a CVD (chemical vapor deposition) method, anisotropic dry etching is conducted thereto to form side spacers, and the diffusion layers at a high impurity concentration are provided in a self-aligning manner by ion implantation. As to the diffusion layer at a low impurity concentration, in the case of the p− 120 of the PMOS 112, boron or $BF_2$ is used as an impurity at a concentration of approximately $1\times10^{16}$ to $1\times10^{18}$ atoms/cm$^3$, and in the case of the n− 119 of the NMOS 113, phosphorous or arsenic is used as an impurity at a concentration of approximately $1\times10^{16}$ to $1\times10^{18}$ atoms/cm$^3$. As to the diffusion layer at a high impurity concentration, in the case of the p+ 104 of the PMOS 112, boron or $BF_2$ is used as an impurity at a concentration of $1\times10^{19}$ atoms/cm$^3$ or more, and in the case of the n+ 103 of the NMOS 113, phosphorous or arsenic is used as an impurity at a concentration of $1\times10^{19}$ atoms/cm$^3$ or more.

The width of a side spacer 121 is generally 0.2 μm to 0.5 μm. FIG. 8 shows an example of the p+ polycrystalline silicon single layer as the gate electrode, but the p+ polycide structure shown in FIG. 4 can also be used as the gate electrode. Similarly, as to the resistor, only the p− resistor is shown in FIG. 8, but the n− resistor, the p+ resistor, and the n+, resistor shown in FIG. 1 or 5 may be selectively applied as the occasion demands. Further, the thin film metal resistor shown in FIG. 2 may be adopted.

Figure 9:
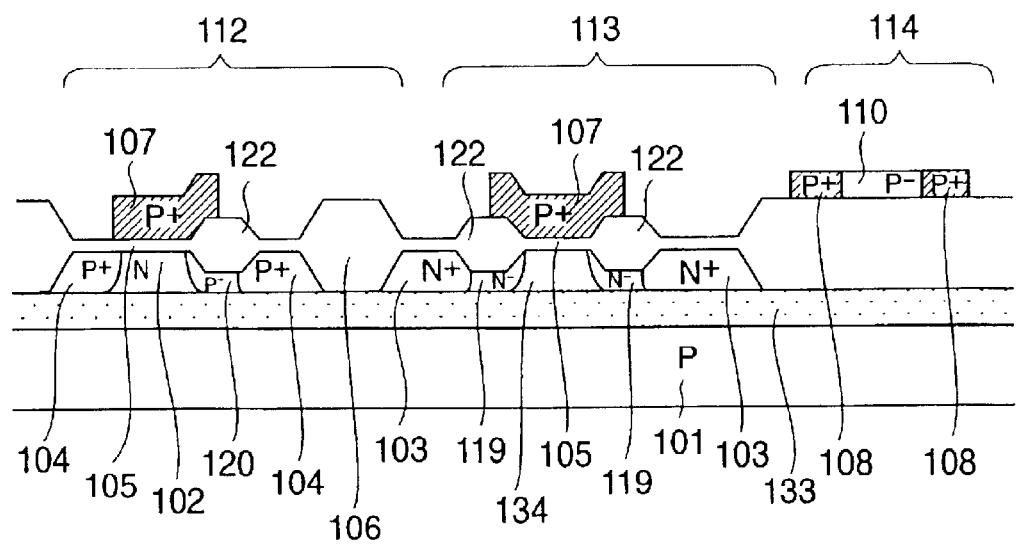
FIG. 9 is a schematic sectional view of another embodiment of a CMOS semiconductor device according to the present invention.

FIG. 9 is a schematic sectional view of another embodiment of a CMOS semiconductor device according to the present invention. In FIG. 9, the CMOS with a gate electrode formed of the p+ polycrystalline silicon 107 of a single polarity which is the basis of the present invention is shown, and has the same effect of low voltage operation, low power consumption, and low cost as in the embodiment in FIG. 1. Further, the CMOS has a MOS transistor structure in which a source and a drain and only a drain are respectively provided as the diffusion layers n− 119 and p− 120 at a low impurity concentration and a source and a drain and only a drain are respectively provided as the diffusion layers n+ 103 and p+ 104 at a high impurity concentration which are provided apart from the gate electrodes with an insulating film 122 with a thickness that does not reach the buried insulating film which is sandwiched between the diffusion layers n+ 103 and p+ 104 and the gate electrodes. This structure is taken with the purpose of obtaining the same effect as that of the structure shown in FIG. 6, but this embodiment is different from the embodiment shown in FIG. 6 in that this embodiment has a merit that, since the thick insulating film is formed between the diffusion layers at a high impurity concentration and the gate electrodes, the effect of electric field relaxation is large, and the CMOS can be adapted for a high pressure-resistance operation, for example, an operation at several tens V to several hundreds V. However, this embodiment has a demerit that the element size cannot be made small.

The structure shown in FIG. 9 is formed such that: for example, the diffusion layers at a low impurity concentration are selectively formed; then, the thick insulating film is formed in the portions between the gate electrode and the source and drain and the portion between the gate electrode and the drain; and after the formation of the gate electrodes, the diffusion layers at a high impurity concentration are formed. This thick insulating film cannot have the same thickness as the field insulating film for element separation. As to the diffusion layer at a low impurity concentration, in the case of the p− 120 of the PMOS 112, boron or $BF_2$ is used as an impurity at a concentration of approximately $1\times10^{16}$ to $1\times10^{18}$ atoms/cm$^3$, and in the case of the n− 119 of the NMOS 113, phosphorous or arsenic is used as an impurity at a concentration of approximately $1 \times 10^{16}$ to $1 \times 10^{18}$ atoms/cm$^3$. As to the diffusion layer at a high impurity concentration, in the case of the p+ 104 of the PMOS 112, boron or BF$_2$ is used as an impurity at a concentration of $1 \times 10^{19}$ atoms/cm$^3$ or more, and in the case of the n+ 103 of the NMOS 113, phosphorous or arsenic is used as an impurity at a concentration of $1 \times 10^{19}$ atoms/cm$^3$ or more.

The insulating film formed between the gate electrode and the drain has a thickness thinner than that of a field oxide film for element separation. At this time, the insulating film is formed with a thickness of several thousands Å so as not to reach the buried insulating film although depending on the thickness of the p-type semiconductor thin film layer. The distance from the gate electrode to the diffusion layer at a high impurity concentration is generally about 1 µm to several µm although depending on the voltage input to a semiconductor device. In FIG. 9, the PMOS 112 has a high withstand voltage structure only on one side thereof while the NMOS 113 has a high withstand voltage structure on both sides thereof. However, an appropriate structure for a circuit can be selected in accordance with the method of using an element in the circuit irrespective of a conductivity type of a MOS transistor. Normally, in the case where a current direction is a two-way direction and a withstand voltage is needed in the two-way direction with which a source and a drain are exchanged on a case-by-case basis, each of the source and the drain takes the high withstand voltage structure, and in the case where a current direction is a one-way direction and a source and a drain are fixed, only one side, namely, only the drain takes the high withstand voltage structure in order to reduce a parasitic capacitance. Further, FIG. 9 shows an example of the p+ polycrystalline silicon single layer as the gate electrode, but the p+ polycide structure shown in FIG. 4 can also be used as the gate electrode. Similarly, as to the resistor, only the p− resistor is shown in FIG. 9, but the n− resistor, the p+ resistor, and the n+ resistor shown in FIG. 1 or 5 may be selectively applied as the occasion demands. Further, the thin film metal resistor shown in FIG. 2 may be adopted.

Next, FIGS. 10 to 17 show other structures of the embodiments of the CMOS semiconductor devices according to the present invention, which are shown in FIGS. 1, 2, and 4 to 9.

Figure 10:
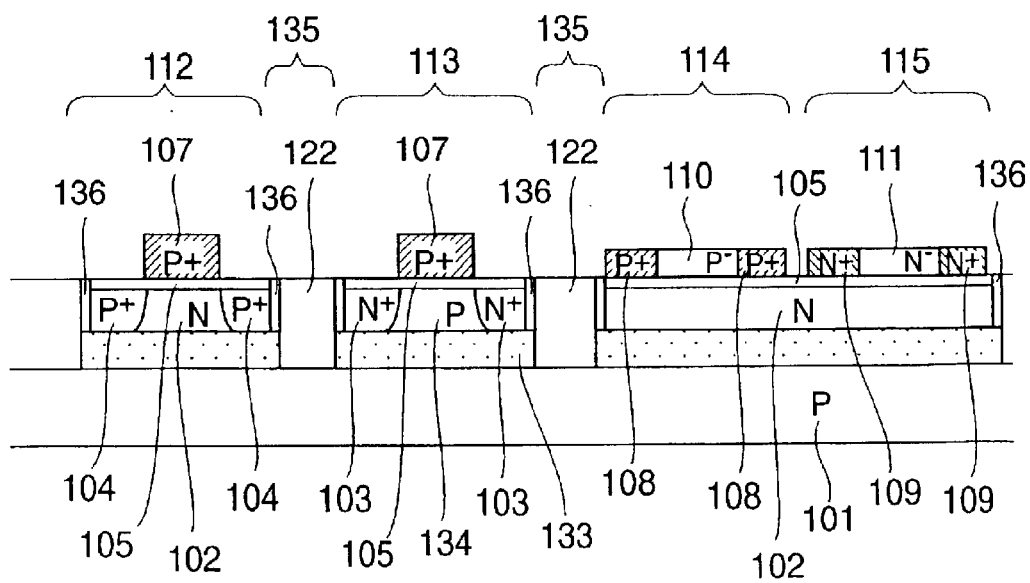
FIG. 10 is a schematic sectional view of another embodiment of a CMOS semiconductor device according to the present invention.

FIG. 10 is a schematic sectional view of another structure of the CMOS semiconductor device according to the present invention, which is shown in FIG. 1. An element separation structure in FIG. 1 is formed by the field insulating film 106 formed by a LOCOS method. In FIG. 10, in CMOS element separation, a part of the p-type semiconductor thin film 134 is etched to the depth that reaches the buried insulating film 133, and the insulating film 122, which is deposited by a CVD (chemical vapor deposition) method, is buried through a thermal oxidization insulating film 136, thereby forming trench separation 135. The element separation is completely realized by the trench separation 135. Note that, polycrystalline silicon may be used as a material to be buried into a trench instead of the insulating film. Further, at this time, a field oxide film can be formed on the polycrystalline silicon in the trench separation although not shown in the figure. In this way, the trench separation is used instead of the field insulating film used for element separation. As a result, the element separation width can further be reduced, and thus, the reduction in size of a chip can be reduced.

Although formed on an n-well through an insulating film, resistors can also be formed on a p-well. Further, although not shown in FIG. 10, the resistors may be formed on the field oxide film formed of a part of the p-type semiconductor thin film layer by a LOCOS method. This can also be applied to the CMOS semiconductor devices shown in FIGS. 11 to 17. Note that the CMOS semiconductor device shown in FIG. 10 has completely the same function and effect as those of the CMOS semiconductor device shown in FIG. 1.

Figure 11:
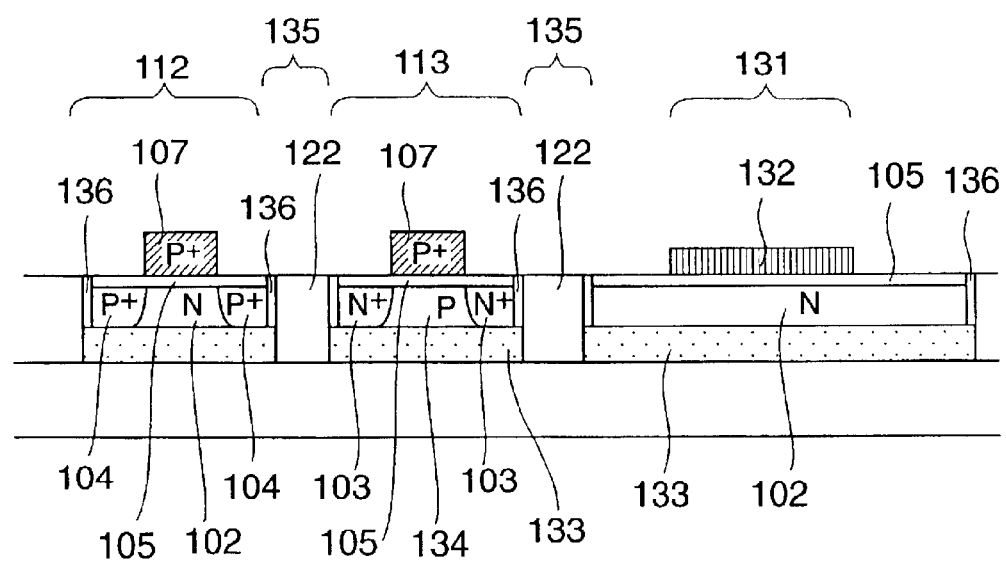
FIG. 11 is a schematic sectional view of another embodiment of a CMOS semiconductor device according to the present invention.

FIG. 11 is a schematic sectional view of another structure of the CMOS semiconductor device according to the present invention, which is shown in FIG. 2. Complete element separation is realized by the trench separation 135 in the same way as shown in FIG. 10. The CMOS semiconductor device shown in FIG. 11 has completely the same function and effect as those of the CMOS semiconductor device shown in FIG. 2.

Figure 12:
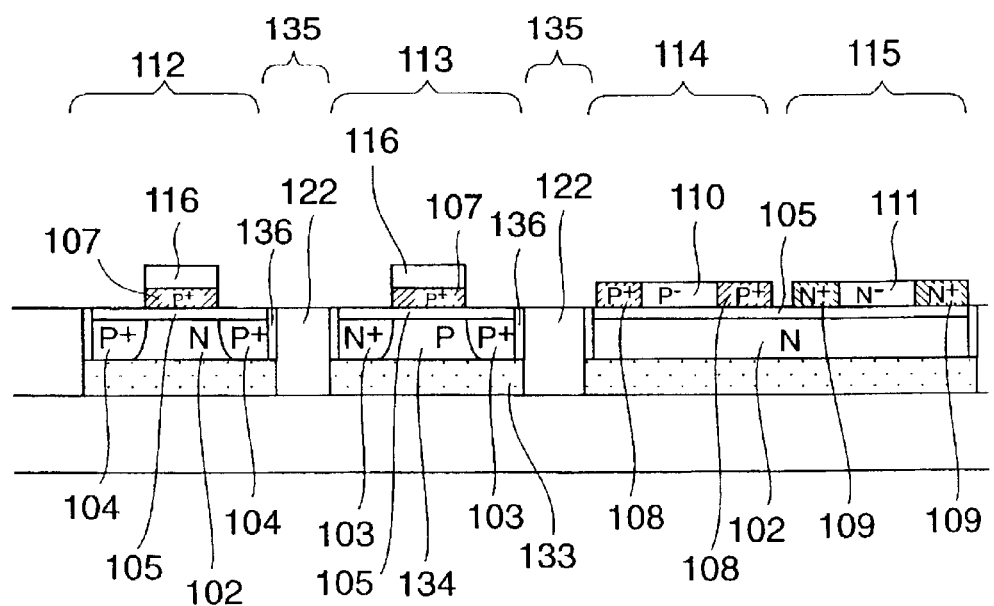
FIG. 12 is a schematic sectional view of another embodiment of a CMOS semiconductor device according to the present invention.

FIG. 12 is a schematic sectional view of another structure of the CMOS semiconductor device according to the present invention, which is shown in FIG. 4. Complete element separation is realized by the trench separation 135 as a substitute for the field insulating film in the same way as shown in FIG. 10. The CMOS semiconductor device shown in FIG. 12 has completely the same function and effect as those of the CMOS semiconductor device shown in FIG. 4.

Figure 13:
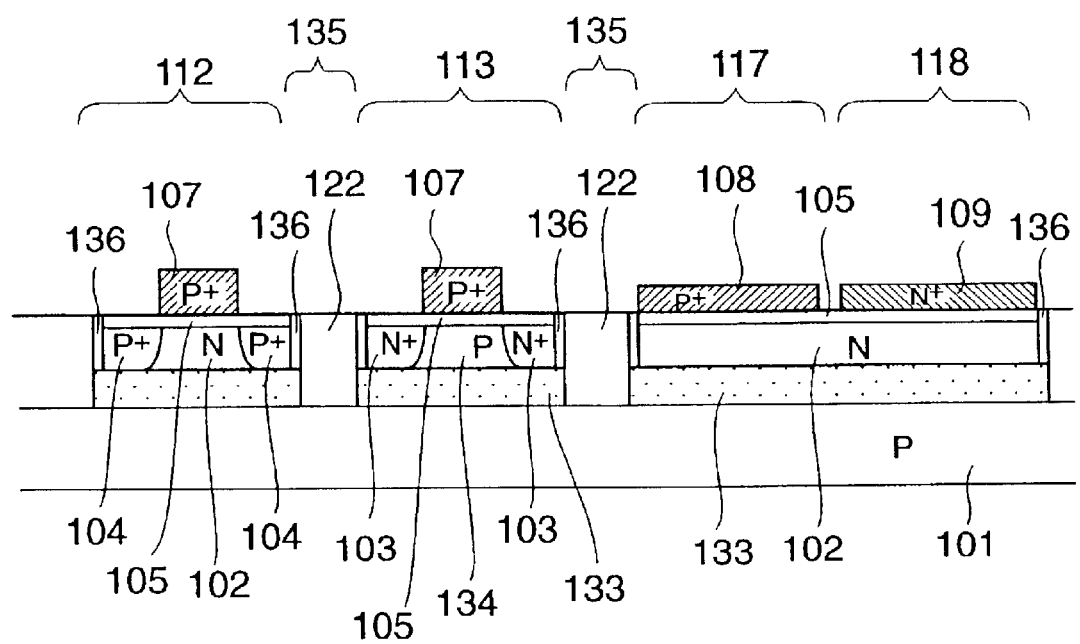
FIG. 13 is a schematic sectional view of another embodiment of a CMOS semiconductor device according to the present invention.

FIG. 13 is a schematic sectional view of another structure of the CMOS semiconductor device according to the present invention, which is shown in FIG. 5. Complete element separation is realized by the trench separation 135 as a substitute for the field insulating film in the same way as shown in FIG. 10. The CMOS semiconductor device shown in FIG. 13 has completely the same function and effect as those of the CMOS semiconductor device shown in FIG. 5.

Figure 14:
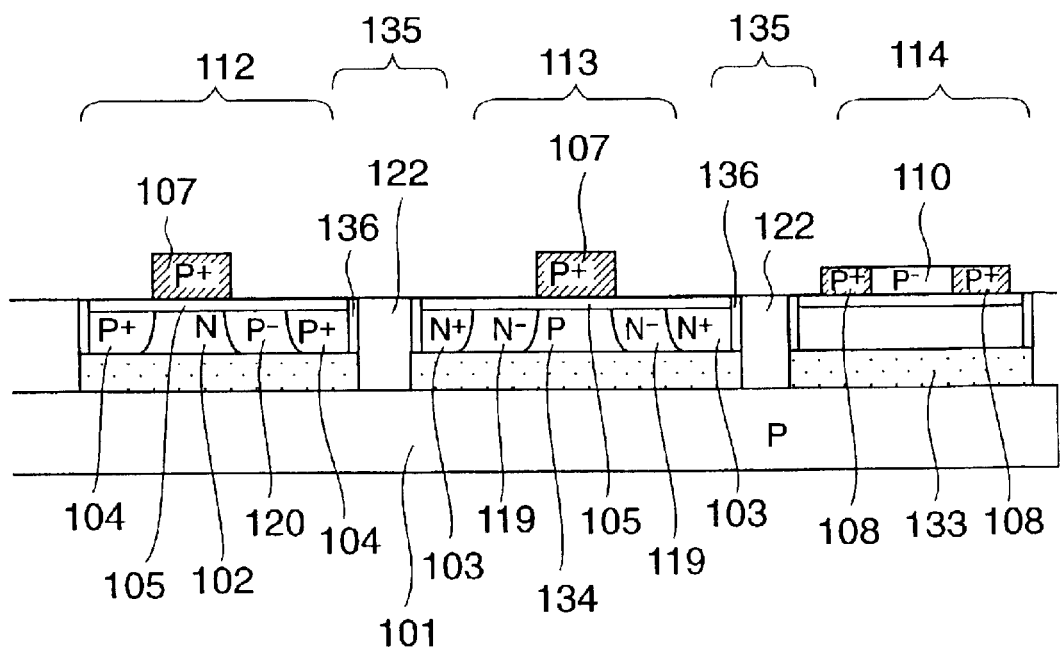
FIG. 14 is a schematic sectional view of another embodiment of a CMOS semiconductor device according to the present invention.

FIG. 14 is a schematic sectional view of another structure of the CMOS semiconductor device according to the present invention, which is shown in FIG. 6. Complete element separation is realized by the trench separation 135 as a substitute for the field insulating film in the same way as shown in FIG. 10. The CMOS semiconductor device shown in FIG. 14 has completely the same function and effect as those of the CMOS semiconductor device shown in FIG. 5.

Figure 15:
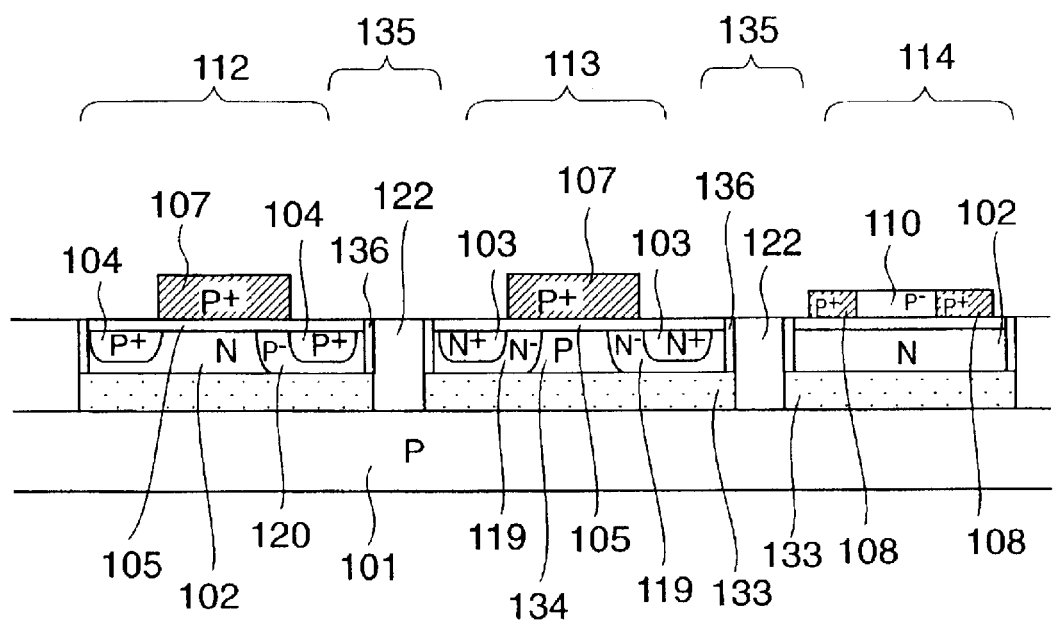
FIG. 15 is a schematic sectional view of another embodiment of a CMOS semiconductor device according to the present invention.

FIG. 15 is a schematic sectional view of another structure of the CMOS semiconductor device according to the present invention, which is shown in FIG. 7. Complete element separation is realized by the trench separation 135 as a substitute for the field insulating film in the same way as shown in FIG. 10. The CMOS semiconductor device shown in FIG. 15 has completely the same function and effect as those of the CMOS semiconductor device shown in FIG. 7.

Figure 16:
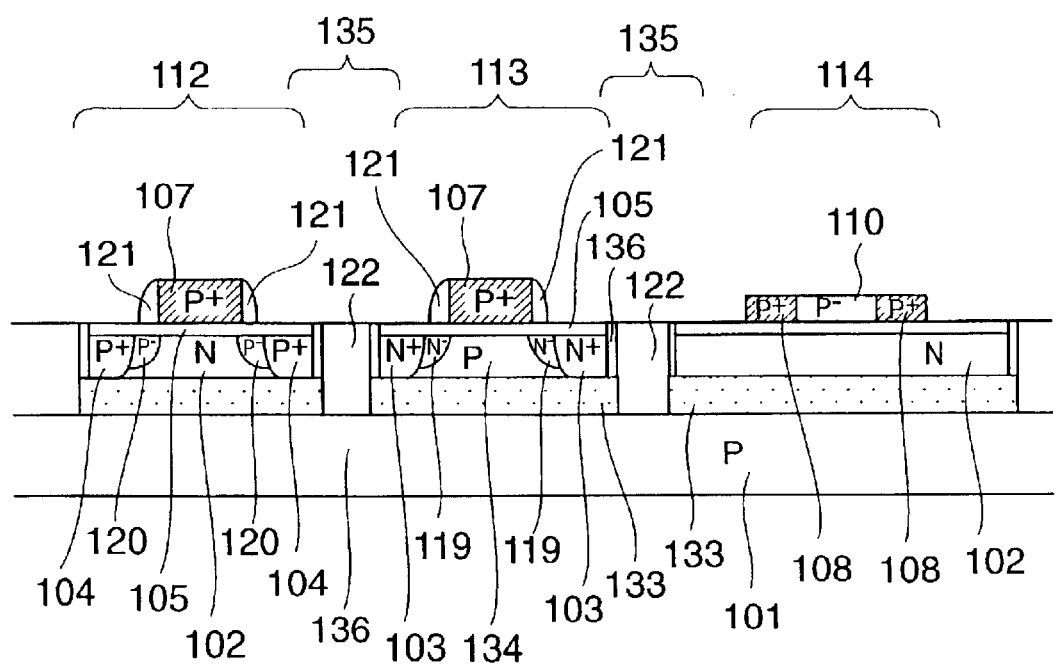
FIG. 16 is a schematic sectional view of another embodiment of a CMOS semiconductor device according to the present invention.

FIG. 16 is a schematic sectional view of another structure of the CMOS semiconductor device according to the present invention, which is shown in FIG. 8. Complete element separation is realized by the trench separation 135 as a substitute for the field insulating film in the same way as shown in FIG. 10. The CMOS semiconductor device shown in FIG. 16 has completely the same function and effect as those of the CMOS semiconductor device shown in FIG. 8.

Figure 17:
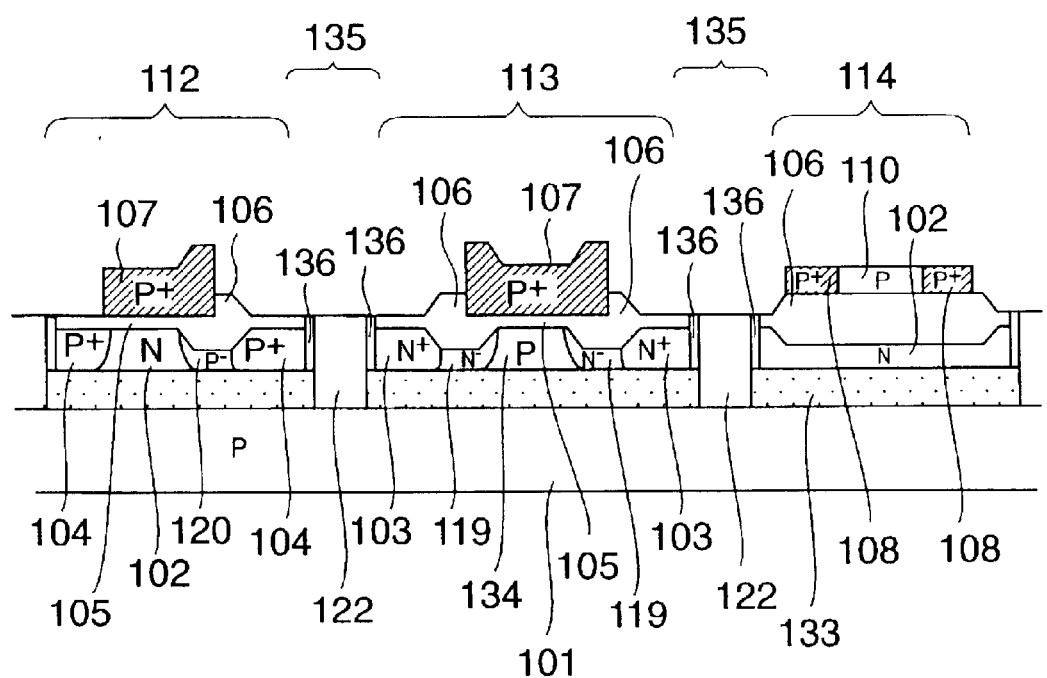
FIG. 17 is a schematic sectional view of another embodiment of a CMOS semiconductor device according to the present invention.
Figure 18:
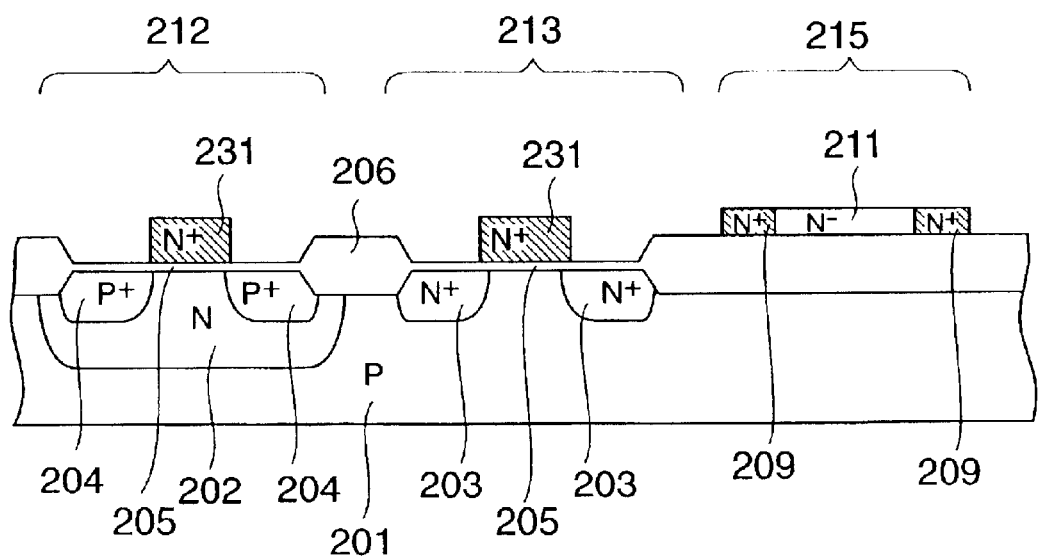
FIG. 18 is a schematic sectional view of a conventional CMOS semiconductor device.
Figure 19:
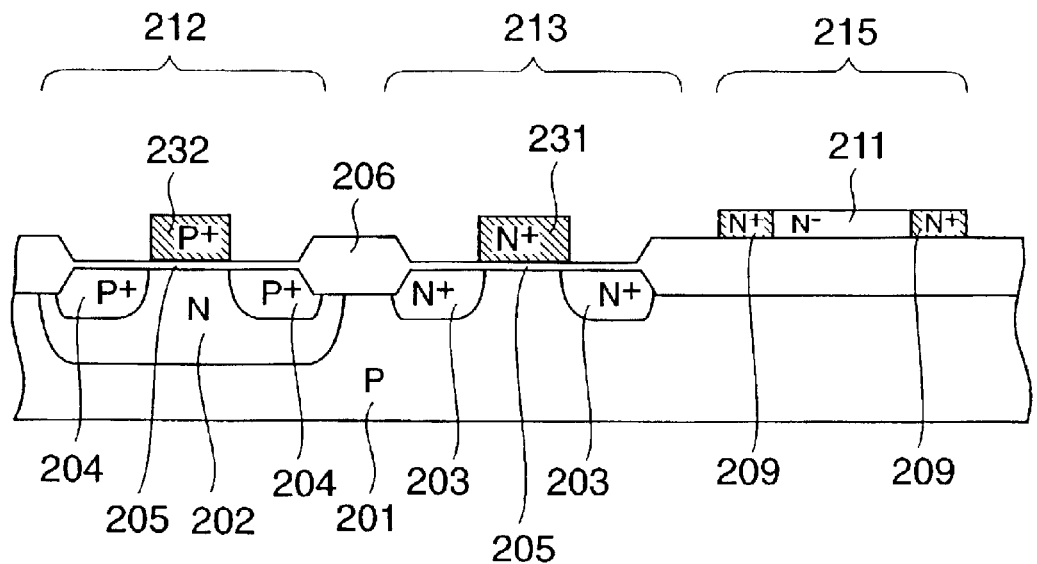
FIG. 19 is a schematic sectional view of a conventional CMOS semiconductor device.
Figure 20:
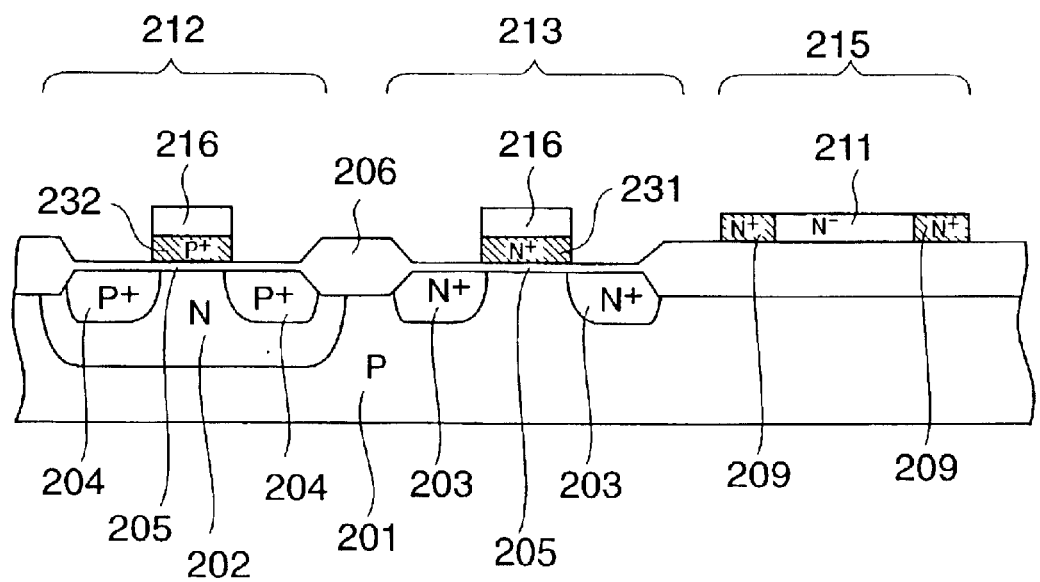
FIG. 20 is a schematic sectional view of a conventional CMOS semiconductor device.

FIG. 17 is a schematic sectional view of another structure of the CMOS semiconductor device according to the present invention, which is shown in FIG. 9. Complete element separation is realized by the trench separation 135 as a substitute for the field insulating film in the same way as shown in FIG. 10. The CMOS semiconductor device shown in FIG. 17 has completely the same function and effect as those of the CMOS semiconductor device shown in FIG. 9.

As described above, the MOS transistors and resistors with various structures are shown by using the SOI substrate in the embodiments in FIGS. 1, 2, and 4 to 17. A semiconductor device with high performance can be manufactured based on an appropriate combination obtained by taking into consideration the specifications required for the semiconductor device and the characteristics of the respective element structures. For example, in a semiconductor device with two or more power supply systems, appropriate structures are selected and combined among the above-described element structures in accordance with not only a voltage band but also the thickness of a gate oxide film in case of necessity.

As described above, the embodiment mode is described with the embodiments in which the p-type semiconductor substrate and the SOI substrate of the p-type semiconductor thin film layer are used. However, an n-type semiconductor substrate and an SOI substrate of an n-type semiconductor thin film layer may also be used. In this case, also by using a CMOS that includes an n-type substrate using an n-type semiconductor thin film layer and a p-well type p+ gate of a single polarity, a semiconductor device which enables low voltage operation, low power consumption, low cost, and high speed operation can also be provided under the same contents and principle as described above.

Further, examples of the SOI substrate include a pasted SOI substrate that is manufactured by bonding semiconductor thin films for forming elements and an SIMOX substrate which is formed such that: oxygen ions are implanted into a semiconductor substrate; and heat treatment is subjected thereto, thereby forming a buried oxide film. Both the substrates may be used in the present invention. Further, in the case of using the pasted SOI substrate, the polarities of a semiconductor thin film layer and a semiconductor substrate can be inverted.

As described above, according to the present invention, in the power management semiconductor device or analog semiconductor device including the CMOS using the SOI substrate and the resistors, the gate electrodes of both the NMOS and the PMOS of the CMOS are each formed of the p-type polycrystalline silicon of a single polarity or have the p-type polycide structure that is a laminate structure of the p-type polycrystalline silicon and the high melting point metal silicide. The PMOS is of surface channel type, and thus, enables a shorter channel and a lower threshold voltage. Also, the NMOS of buried channel type has an extremely shallow buried channel since arsenic having a small diffusion coefficient is used as an impurity for threshold control in the NMOS, and thus, enables a shorter channel and a lower threshold voltage. Further, the resistor used in the voltage dividing circuit or the CR circuit is comprised of the polycrystalline silicon different from that for the gate electrode, and thus, the voltage dividing circuit with high precision is provided. Accordingly, the power management semiconductor device or analog semiconductor device is realized which is operated at a higher speed compared with the case of using a bulk substrate, and which is more advantageous in terms of cost, manufacturing period, and performance of elements than the conventional CMOS with an n+ polycrystalline silicon gate of a single polarity or the same polarity gate CMOS in which a channel and a gate electrode have the same polarity.

What is claimed is:

1. A complementary MOS semiconductor device comprising: an SOI substrate; a complementary transistor pair comprised of an NMOS transistor formed in the SOI substrate and a PMOS transistor formed in the SOI substrate, each of the NMOS and PMOS transistors having a p-type gate electrode; and one or more resistors provided on the SOI substrate adjacent the complementary transistor pair and formed of a material different from that used to form the gate electrodes of the NMOS and PMOS transistors.

2. A complementary MOS semiconductor device according to claim 1; wherein the p-type gate electrodes of the NMOS and PMOS transistors are formed of a single patterned polycrystalline silicon layer having a film thickness in the range of about 2000 Å to 6000 Å.

3. A complementary MOS semiconductor device according to claim 1; wherein the one or more resistors comprise at least one n-type polycrystalline silicon resistor having a relatively low impurity concentration of phosphorous or arsenic at an impurity concentration in the range of about $1 \times 10^{14}$ to $9 \times 10^{18}$ atoms/cm$^3$ and a sheet resistance value in the range of approximately several KΩ/□ to several tens of KΩ/□.

4. A complementary MOS semiconductor device according to claim 1; wherein the one or more resistors comprise at least one n-type polycrystalline silicon resistor having a relatively high impurity concentration of phosphorous or arsenic at an impurity concentration in the range of about $1 \times 10^{19}$ to $5 \times 10^{21}$ atoms/cm$^3$, a sheet resistance value in the range of approximately 100 Ω/□ to several hundreds Ω/□, and a temperature coefficient in the range of approximately several hundred ppm/° C. to several thousand ppm/° C.

5. A complementary MOS semiconductor device according to claim 1; wherein the one or more resistors comprise at least one p-type polycrystalline silicon resistor having a relatively low impurity concentration of boron or BF$_2$ at an impurity concentration in the range of about $1 \times 10^{14}$ to $9 \times 10^{18}$ atoms/cm$^3$ and a sheet resistance value in the range of approximately several KΩ/□ to several tens of KΩ/□.

6. A complementary MOS semiconductor device according to claim 1; wherein the one or more resistors comprise at least one p-type polycrystalline silicon resistor having a relatively high concentration of boron or BF$_2$ at an impurity concentration in the range of about $1 \times 10^{19}$ to $5 \times 10^{21}$ atoms/cm$^3$, a sheet resistance value in the range of approximately several hundreds of KΩ/□ to 1 KΩ/□, and a temperature coefficient in the range of approximately several hundred ppm/° C. to several thousands ppm/° C.

7. A complementary MOS semiconductor device according to claim 1; wherein the one or more resistors comprise one or more thin film metal resistors comprised of one of Ni—Cr alloy, chrome silicide, molybdenum silicide, or a-ferrite silicide, and have a thickness in the range of about 100 Å to 300 Å.

8. A complementary NOS semiconductor device according to claim 1; wherein the p-type gate electrodes of the NMOS and PMOS transistors are formed of a polycrystalline silicon layer containing boron or BF$_2$ at a concentration of at least $1 \times 10^{18}$ atoms/cm$^3$.

9. A complementary MOS semiconductor device according to claim 1; wherein the NNOS and PMOS transistors each have source and drain regions comprised of a single diffusion layer having a high impurity concentration.

10. A complementary MOS semiconductor device according to claim 1; wherein at least one of the NMOS and PMOS transistors has a low impurity concentration diffusion region in a source and a drain region thereof which overlaps the p-type gate electrode thereof in a planar manner and a high impurity concentration diffusion region in the drain region or in both the source and drain regions which does not overlap the p-type gate electrode; and wherein an insulating film interposed between the high impurity concentration diffusion region and the p-type gate electrode thereof is thicker than a gate insulating film thereof.

11. A complementary MOS semiconductor device according to claim 1; wherein at least one of the NMOS and PMOS transistors has a high impurity concentration diffusion region in a source or a drain region thereof and a low impurity concentration diffusion region in the drain region or both the source and drain regions thereof that extends closer to a channel side thereof than the high impurity concentration diffusion region and which overlaps the p-type gate electrode thereof in a planar manner.

12. A complementary MOS semiconductor device according to claim 1; wherein the PMOS transistor is an enhancement mode transistor having a surface channel.

13. A complementary MOS semiconductor device according to claim 1; wherein the insulating film formed on the semiconductor substrate has a thickness of 0.1 $\mu$m to 1 $\mu$m.

14. A complementary MOS semiconductor device according to claim 1; wherein the p-type gate electrodes of the NMOS and PMOS transistors are formed by patterning a single layer of polycrystalline silicon having a thickness in a range of 2000 Å to 6000 Å and including boron or $BE_2$ with an impurity concentration of at least $1\times10^{18}$ atoms/cm$^3$.

15. A complementary MOS semiconductor device according to claim 1; wherein the NMOS transistor is an enhancement mode transistor having a buried channel.

16. A complementary MOS semiconductor device according to claim 15; wherein a threshold voltage of the NMOS transistor is set using arsenic as a donor impurity so that the buried channel is a shallow buried channel.

17. A complementary MOS semiconductor device according to claim 1; wherein the p-type gate electrodes of the NMOS and PMOS transistors are formed of a lamination of a patterned polycrystalline silicon layer and a patterned high melting point metal suicide layer.

18. A complementary MOS semiconductor device according to claim 17; wherein the high melting point metal suicide layer is formed of one of tungsten silicide, molybdenum silicide, titanium silicide, and platinum suicide.

19. A complementary MOS semiconductor device according to claim 17; wherein the polycrystalline silicon layer has a thickness in the range of about 500 Å to 2500 Å, and the high melting point metal silicide layer has a thickness in the range of about 500 Å to 2500 Å.

20. A complementary MOS semiconductor device according to claim 1; wherein at least one of the NMOS and PMOS transistors has a low impurity concentration diffusion region in source and drain regions thereof which overlaps the p-type gate electrode thereof in a planar manner and a high impurity concentration diffusion region in the drain region thereof or in both the source and drain regions thereof which does not overlap the p-type gate electrode thereof.

21. A complementary MOS semiconductor device according to claim 20; wherein an impurity concentration of the low impurity concentration diffusion region is in the range of about $1\times10^{16}$ to $1\times10^{18}$ atoms/cm$^3$, and an impurity concentration of the high impurity concentration diffusion region is at least $1\times10^{19}$ atoms/cm$^3$.

22. A complementary MOS semiconductor device according to claim 20; wherein the low impurity concentration region is formed in the NMOS transistor of phosphorous, and the high impurity concentration diffusion region is formed in the NMOS transistor of arsenic or phosphorous.

23. A complementary MOS semiconductor device according to claim 20; wherein the low impurity concentration diffusion region is formed in the PMOS transistor of boron or $BF_2$, and the high impurity concentration diffusion region is formed in the PMOS transistor of boron or $BF_2$.

24. A complementary MOS semiconductor device according to claim 1; herein the p-type gate electrodes of the NMOS and PMOS transistors are formed by patterning a first polycrystalline silicon layer.

25. A complementary MOS semiconductor device according to claim 24; wherein the one or more resistors are formed by patterning a second polycrystalline silicon layer.

26. A complementary MOS semiconductor device according to claim 25; wherein the second polycrystalline silicon layer is different from the first polycrystalline silicon layer.

27. A complementary MOS semiconductor device according to claim 25; wherein the one or more resistors each have a thickness in the range of about 500 Å to 2500 Å.

28. A complementary MOS semiconductor device according to claim 25; wherein the one or more resistors comprise at least one of a p-type resistor or an n-type resistor having a relatively low impurity concentration.

29. A complementary MOS semiconductor device according to claim 25; wherein the one or more resistors comprise at least one of a p-type resistor or an n-type resistor having a relatively high impurity concentration.

30. A complementary MOS semiconductor device according to claim 1; wherein the SOI substrate comprises a supporting substrate, an insulating layer provided on the supporting substrate, and a semiconductor layer provided on the insulating layer and in which the NMOS and PMOS transistors are formed.

31. A complementary MOS semiconductor device according to claim 30; wherein the semiconductor layer has a thickness in the range of about 0.1 $\mu$m to 1 $\mu$m.

32. A complementary MOS semiconductor device according to claim 30; wherein the insulating layer is a buried insulating layer.

33. A complementary MOS semiconductor device according to claim 30; wherein the insulating layer is formed of one of glass, sapphire, a ceramic, a silicon oxide film, and a silicon nitride film.

34. A complementary MOS semiconductor device according to claim 30; further comprising an element separation structure formed on the semiconductor layer comprised of an insulating film formed by a LOCOS method.

35. A complementary MOS semiconductor device according to claim 30; further comprising an insulating layer interposed between the semiconductor layer and the one or more resistors.

36. A complementary MOS semiconductor device according to claim 30; further comprising an element separation structure formed on the semiconductor layer and comprised of a trench element separation structure in which the semiconductor layer is etched to a depth that reaches the insulating film to form a concave portion.

37. A complementary MOS semiconductor device according to claim 36; wherein the interior of the concave portion of the trench element separation structure is filled by a deposited insulating film.

38. A complementary MOS semiconductor device according to claim 36; wherein the interior of the concave portion of the trench element separation structure is filled with a polycrystalline silicon layer different from the material used to form the gate electrodes of the NMOS and PMOS transistors and the one or more resistors.

39. A CMOS power management semiconductor device comprising: a substrate; CMOS transistor pairs formed in the substrate each comprising an NMOS transistor having a p-type gate and a PMOS transistor having a p-type gate; and resistors provided on the substrate adjacent the CMOS transistor pairs, the resistors being formed of a different material than the gate electrodes of the NMOS and PMOS transistors.

40. A CMOS power management semiconductor device according to claim 39; wherein the gate electrodes of the NMOS and PMOS transistors are formed of a first patterned layer of polycrystalline silicon and the resistors are formed of a second patterned layer of polycrystalline silicon.

41. A CMOS power management semiconductor device according to claim 39; wherein the gate electrodes of the NMOS and PMOS transistors are formed of a polycide material.

42. A CMOS power management semiconductor device according to claim 39; wherein the resistors are thin film metal resistors.

* * * * *